United States Patent [19]

Nara et al.

[11] 3,932,880

[45] Jan. 13, 1976

[54] SEMICONDUCTOR DEVICE WITH SCHOTTKY BARRIER

[75] Inventors: Aiichiro Nara; Hisao Kondo; Masatoshi Mizushima; Fumi Moriai, all of Amagasaki, Japan

[73] Assignee: Mitsubishi Denki Kabushiki Kaisha, Tokyo, Japan

[22] Filed: Nov. 26, 1974

[21] Appl. No.: 527,427

[30] Foreign Application Priority Data
Dec. 1, 1973   Japan.......................... 48-13593

[52] U.S. Cl. ...................... 357/15; 357/52; 357/67; 357/71
[51] Int. Cl.² .................. H01L 29/46; H01L 29/48
[58] Field of Search .............. 357/15, 52, 65, 67, 71

[56] References Cited
UNITED STATES PATENTS

| | | | |
|---|---|---|---|
| 3,636,417 | 1/1972 | Kimura................................. | 357/15 |
| 3,699,408 | 10/1972 | Shinoda et al......................... | 357/15 |
| 3,775,200 | 11/1973 | de Nobel et al.................. | 357/15 X |

*Primary Examiner*—Siegfried H. Grimm
*Attorney, Agent, or Firm*—Wenderoth, Lind & Ponack

[57] ABSTRACT

A nickel-palladium alloy in the form of a layer is contacted by one portion of one main face of a semiconductor substrate to form a Schottky barrier. A gold layer is disposed upon the nickel-palladium layer and an electrically insulating film is disposed on the remaining portion of the one main substrate face to contact and surround both layers. The film has a thickness equal to or greater than the sum of thicknesses of both layers.

13 Claims, 3 Drawing Figures

SEMICONDUCTOR DEVICE WITH SCHOTTKY BARRIER

BACKGROUND OF THE INVENTION

This invention relates to a semiconductor device including a Schottky barrier and more particularly to means for thermally stabilizing electric characteristics of a Schottky barrier included in a semiconductor device.

It is well known that the Schottky barrier is formed in semiconductors adjacent those portions thereof contacted by metallic members and there have been previously propsed many types of semiconductor devices utilizing the electric characteristics of the Schottky barrier. Some of such types of semiconductor devices have been already put to practical use and very frequently included the substrate of semiconductive material having disposed thereon the metallic layer formed of nickel. This nickel layer has been contacted by the substrate to form a Schottky barrier at the interface of the layer and substrate.

Semiconductor devices of the type referred to are often used at fairly high temperatures and therefore it is desirable to maintain the electric characteristics of those semiconductor device unchanged even at fairly high temperatures. In other words, it is desirable to provide semiconductor devices of the type referred to be thermally stable in electric characteristics. It has been found that the Schottky barrier formed by contacting the nickel layer with the semiconductor substrate is thermally unstable in electric characteristics so that, when continuously subjectd to heat treatment in the atmosphere at 200° C for one hour, the electric characteristics thereof have been considerably changed.

The applicants have studied causes for which semiconductor devices having the Schottky barrier formed by contacting the nickel layer with the semiconductor substrate are changed in electric characteristics after they have been subject to heat treatment in the atmosphere. As a result, it has been estimated that one of the causes is to oxidize the nickel layer due to the heat treatment in the atmosphere. It is believed that this oxidation of the nickel layer will change the composition of the metallic layer and also the electric characteristics of the Schottky barrier. It has been also found that the oxidation of the nickel layer occurs with an additional layer of another metal such as gold covering the nickel layer in order to facilitate the bonding of an external lead to the nickel layer. In that event it has been estimated that oxygen diffused into the nickel layer through the additional layer oxidizes the nickel layer. Also it has been found that, with the additional metallic layer disposed upon the nickel layer, atoms of a metal forming the additional layer, for example, gold are diffused through the nickel layer into the semiconductor substrate due to the particular heat treatment. The diffused metallic atoms have reacted on the semiconductive material of the substrate. It has been estimated that this provides a second cause for which the Schottky barrier changes in electric characteristics. In addition, it has been found that, when thermally treated, the metal forming the additional metallic layer is alloyed with nickel forming the first layer. This alloying causes an increase in electric resistivity of the first layer and the occurence of strains in the crystal lattice of the first layer. Therefore it has been estimated that the alloying provides a third cause for which the Schottky barrier changes in electric characteristics.

Although the second and third causes as above described offer no problem with semiconductor devices not including the additional metallic layer as above described, that layer has been, in many cases, provided on semiconductor devices including the Schottky barrier in order to make it possible to bond a lead to the device. Therefore the second and third causes are also important.

It is an object of the present invention to provide a new and improved semiconductor device including a Schottky barrier thermally stable in electric characteristics by preventing any changes in the electric characteristics due to the causes as above described.

Furthermore semiconductor devices of the type referred to are desirable to be small in a stray capacity relative to the Schottky barrier involved for the purpose of handling high frequency signals.

Thus it is another object of the present invention to provide a new and improved semiconductor device including a Schottky barrier exhibiting the thermally stable electric characteristics and low in a stray capacity relative to the Schottky barrier.

SUMMARY OF THE INVENTION

According to the principles of the present invention there is provided a semiconductor device comprising a substrate of semiconductive material, and a metallic member disposed on the substrate to be contacted by the latter thereby to form a Schottky barrier in the substrate adjacent that portion thereof contacted by the metallic member, the metallic member being composed of a nickel-palladium alloy.

In order to decrease a stray capacity relative to the Schottky barrier, the semiconductor device may comprise preferably a substrate of semiconductor material including a pair of first and second main faces opposite to each other, a surface passivation film of electrically insulating material disposed so as to cover that portion of the first main face except for a predetermined portion thereof, a first metallic layer formed of a nickel-palladium alloy and disposed so as to contact the predetermined portion of the first main face thereby to form a Schottky barrier in the substrate adjacent that portion thereof contacted by the first metallic layer, and a second metallic layer disposed to cover the first metallic layer, the sum of the thickness of the first and second metallic layers not exceeding the thickness of the surface passivation film.

BRIEF DESCRIPTION OF THE DRAWING

The present invention will become more readily apparant from the following detailed description taken in conjunction with the accompanying drawing in which.

DESCRIPTION OF THE PREFERRED EMBODIMENT

Figure 1:
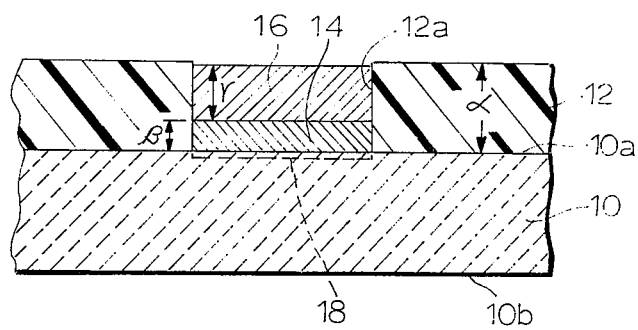
FIg. 1 is a fragmental sectional view of a semiconductor device constructed in accordance with the principles of the present invention.

Referring now to FIG. 1 of the drawing, it is seen that the arrangement disclosed herein comprises a substrate 10 of semiconductive material including a pair of first and second main faces 10A and 10B opposite to each other, a surface passivation film 12 disposed on that portion of the first main face 10A of the substrate 10 except for a predetermined portion thereof, in this case the central portion thereof, and a first metallic layer 14 disposed on the predetermined portion of the main substrate face 10A and a second metallic layer 16 disposed upon the first metallic layer 14.

The substrate 10 may be composed of any desired one of semiconductive materials such as any one of III–V semiconductive compounds, II–VI semiconductive compounds and IV semiconductive materials.

The surface passivation film 12 may be formed of any suitable, electrically insulating materials. Typical examples of such a insulating material involve silicon dioxide ($SiO_2$), and silicon nitride ($Si_3N_4$). With silicon dioxide used, the surface film 12 may be formed according to chemical vapor deposition technique or sputtering technique well known in the art. In the substrate formed of silicon, the same may be thermally oxided in the well known manner to form the surface passivation film 12. On the other hand, chemical vapor deposition technique can be used to form the surface film 12 of silicon nitride. In order to dispose the surface passivation film 12 on that portion of the first main substrate face 10A except for the predetermined portion thereof, photolithographic technique well known may be used to form a through opening 12A in that portion of the surface film underlaid by the predetermined portion of the main face 10A until that face portion is exposed. The thickness of the surface passivation film 12 preferably ranges from 0.5 to 2 microns.

Then the first metallic layer 14 is disposed within the opening 12A on the predetermined portion of the main face 10A to be directly contacted by the latter portion to form a Schottky barrier 18 at the interface of the first metallic layer 14 and the substrate 10 as shown in FIG. 1. According to the principles of the present invention, the first metallic layer 14 is formed of a nickel-palladium alloy by an electrically plating process. More specifically, the substrate 10 including the surface passivation film 12 with the opening 12A is immersed into a plating bath including a nickel plating solution mixed with a palladium plating solution in an appropriate proportion and an anode plate of palladium or carbon is also immersed into the plating bath to oppose to the substrate 10. The anode plate and the substrate are connected to the positive and negative poles of a plating source of direct current respectively for electrically plating. This results in the formation of the first layer 14 formed of a nickel-palladium alloy.

A suitable example of the nickel plating solution can be prepared by dissolving a powder of nickel sulfate ($NiSO_4 \cdot 7H_2O$) into water. The palladium plating solution can be prepared by dissolving a powder of palladium ammonium chloride ($Pd(NH_3)Cl_2$) into water. By changing a proportion of one to the other of the plating solutions, a ratio of nickel atoms to palladium atoms in the first layer 14 can be varied.

As above described, the second metallic layer 16 is disposed upon the first metallic layer 14 so as to cover the entire exposed surface of the latter. The second metallic layer 16 may be formed of a metallic material selected from the group consisting of gold (Au), aluminum (Al), silver (Ag), copper (Cu), solders (Pb-Sn) etc. Normally the second layer 16 is formed of gold (Au). Although the second metallic layer may be formed by electrically plating or vacuum evaporation technique, the electrically plating technique is more effective in that the second metallic layer 16 can be simply formed upon the first metallic layer 14 alone. The purpose of the second metallic layer 16 is to facilitate soldering of an external lead to the first metallic layer. Thus the second metallic layer may be omitted provided that the soldering of such an external lead is not required.

The layer 14 of nickel-palladium alloy has a first property that it becomes difficult to be oxidized as the number of palladium atoms included therein increases. This first property is effective for suppressing the tendency to oxide the first metallic layer 14 when the arrangement of FIG. 1 is put at a fairly high temperature in the atmosphere. This is effective for suppressing a thermal change in electric characteristics of the Schottky barrier 18 at the interface of the first metallic layer 14 and the substrate 10. The layer 14 has also a second property that an increase in the number of palladium atoms is attended with the suppression of the tendency for atoms of other metals to be diffused into the semiconductor substrate through the first layer 14. Further the nickel-palladium layer 14 has a third property that an increase in the number of palladium atoms therein is accompanied by the suppression of the tendency for other metals to be alloyed with the metallic material forming the first layer 14. The second property is effective for suppressing other metals from being diffused through the first layer 14 into the substrate 10 to react on the semiconductive material of the substrate 10 while the third property is effective for suppressing the alloying of one with the other of the metallic materials of both layers 14 and 16. Thus both the second and third properties ensure that the Schottky barrier 18 is prevented from thermally changing in electric characteristics.

It is to be noted that the nickel-palladium layer 14 effectively exhibits the first and second properties even in the absence of the second metallic layer 16. With a semiconductor device of the type referred to without the second metallic layer 16 put in the atmosphere at a high temperature, oxygen contained in the atmosphere tends to directly act upon the first metallic layer 14 while atoms of metals included in the atmosphere tend to touch the first metallic layer 14. Under these circumstances, the first property serves to suppress the oxidation of the first metallic layer 14 while at the same time, the second property serves to suppress the atoms of metals from being diffused into the first metallic layer 14.

The first, second and third properties of the nickel-palladium layer are equally effective in the presence of the second metallic layer 16. In the latter event, the first property is effective for suppressing oxygen from the atmosphere diffused into the first layer 14 through the second layer 16 from oxidizing the layer 14 while the second property is effective for suppressing the atoms of the metallic material forming the layer 16 from being diffused into the substrate 10 through the layer 14. Also the third property is effective for suppressing the alloying of the metallic materials forming both layers 14 and 16 with each other.

Even if the nickel-palladium layer 14 would decrease in the number of palladium atoms to become poor in their first, second and third properties, the layer 14 retains still all those properties to exhibit the effectiveness as above described. Since an increase in the number of palladium atoms included in the first layer 14 is attended with a plenty of the first, second and third properties, it is desirable to increase the number of palladium atoms included in the layer 14 so that the layer 14 has the number of palladium atoms exceeding the number of nickel atoms. However an excessive increase in the number of palladium atoms tends to deteriorate the adherence of the first layer 14 to the substrate 10 while the reproducibility of semicondutor device becomes poor. It has been found that the number of palladium atoms should be equal to or less that four time the number of nickel atoms in the first metallic layer 14 with satisfactory results. In other words, the first layer 14 has preferably a ratio of nickel atoms to palladium atoms ranging from 50 to 50 to 20 to 80.

The thickness $\beta$ (see FIG. 1) of the nickel-palladium layer 14 may be of any desired magnitude. However it has been found that the thickness of the layer 14 should be equal to or larger than 0.3 micron because the thickness of less than 0.3 micron causes pin holes to be apt to occur in the layer 14. In the atmosphere at a high temperature this occurrence of the pin holes results in the diffusion of metal atoms from the atmosphere into the semiconductor substrate 10 through those pin holes in the absence of the second metallic layer 16 and in the diffusion of metal atoms from the layer 16 into the semiconductor substrate 10 through the pin holes in the presence of the second metallic layer 16.

On the other hand, if the nickel-palladium layer 14 is too thick then the layer 14 itself increases in strain. This results in the poor reproducibility of semiconductor devices. In view of the reproducibility it has been found that the thickness of the nickel-palladium layer 14 should be of 1.0 micron or less.

The second metallic layer 16 has preferably a thickness $\gamma$ (see FIG. 1) as large as possible in order to decrease or minimize the number of oxygen atoms diffused into the layer 13 through the same.

In the arrangement as shown in FIG. 1, a stray capacity relative to the Schottky barrier 18 takes place between the metallic layers 14 and 16 and the semiconductor substrate 10. If the sum of the thickness of the layers 14 and 16 or ($\beta + \gamma$) becomes larger than the thickness $\alpha$ (see FIG. 1) of the surface passivation film 12 then the layer 16 or the layer 14 is apt to hang over the exposed surface of the surface passivation film 12 resulting in an increase in the stray capacity as above described. In order that the arrangement of FIG. 1 decreases in stray capacity relative to the Schottky barrier 18, the relationship $\gamma \leq \alpha - \beta$ must be held. In the absence of the second layer 16, the relationship $\beta \leq \alpha$ must be held.

As an example, a semiconductor device such as shown in FIG. 1 was produced as follows: A semiconductor substrate such as the substrate 10 was prepared by forming on a gallium arsenide substrate having an impurity concentration of from 1 to 3 × $10^{18}$ atoms per cubic centimeter an expitaxially grown N type gallium arsenide layer. This epitaxially grown layer had an impurity concentration of from 1 to 3 × $10^{16}$ atoms per cubic centimeter. A pair of main faces such as the main faces 10B and 10A shown in FIG. 1 were formed of the main or exposed surfaces of the $N^+$ and N type layers located in the crystallographic plane [100], respectively.

Then a surface passivation film such as the film 12 shown in FIG. 1 was formed by disposing on the main face of the N type layer a film of silicon dioxide with a thickness $\alpha$ of 1 micron by chemical vapor deposition well known in the art. Subsequently a window or a through opening such as the opening 12A was formed as a predetermined portion of the surface passivation film by well known, photolithographic technique employing the mask.

Thereafter the electrically plating process as above described was used to form a nickel-palladium layer such as layer 14 in the form of a disc having a thickness $\beta$ of 0.3 micron on the exposed surface of the N type layer and a ratio of 50 to 50 of the nickel atoms to palladium atoms. Further a second metallic layer in the form of a disc such as the layer 16 was disposed upon the nickel-palladium layer by depositing gold thereon by electrically plating process. The second layer thus formed had a thickness $\gamma$ of 0.7 micron.

Finally an ohmic contact was disposed on the main face of the $N^+$ type layer to complete a semiconductor device. That device may be called an "embodiment" hereinafter.

Figure 2:
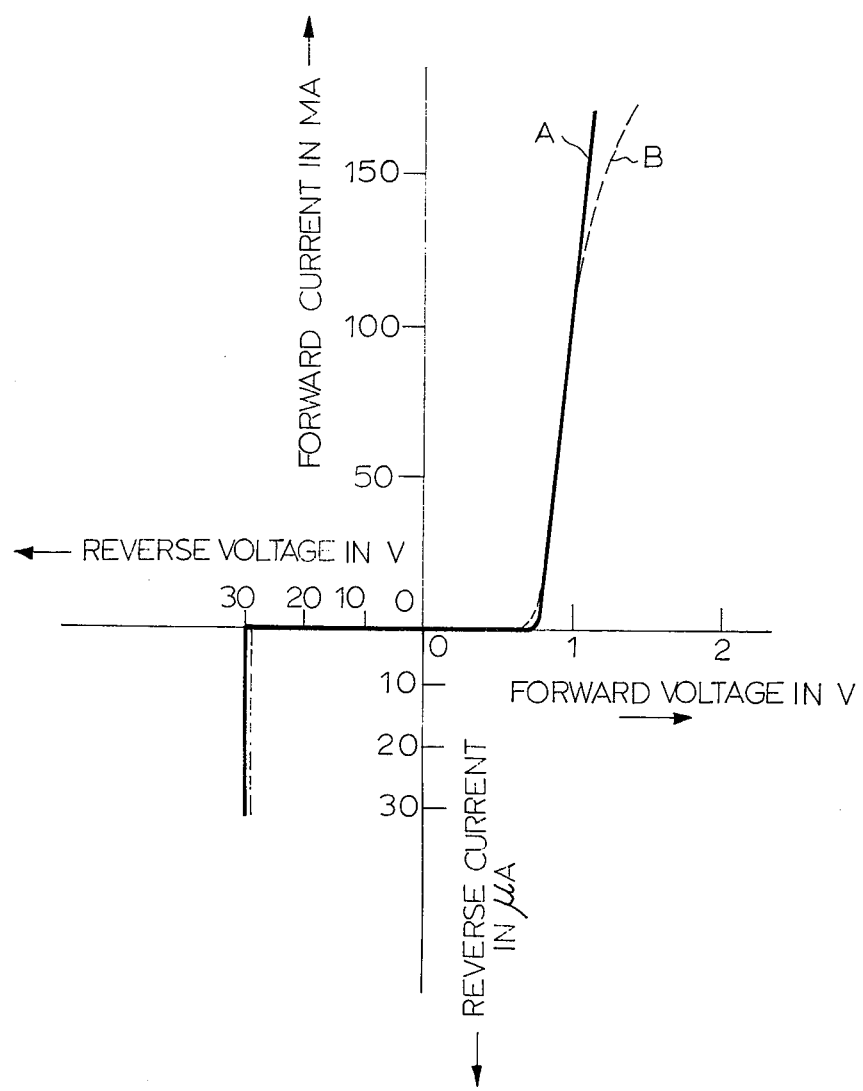
FIG. 2 is a graph illustrating the comparison of the semiconductor device according to the principles of the present invention with that according to the principles of the prior art, in terms of the voltage-to-current characteristic of a Schottky barrier involved.

FIG. 2 shows the voltage-to-current characteristic of a Schottky barrier included in the embodiment as compared with a conventional semiconductor device produced in the same manner as the embodiment except for the substitution of a nickel layer for the nickel-palladium layer included in the embodiment. In FIG. 2 a voltage in volts applied the semiconductor device is plotted in abscissa against a current flowing through the device in ordinate. The forward characteristic shown in a first quadrant of FIG. 2 is obtained with a forward voltage applied across the device to render the metallic layer on the main face of the N type layer positive with respect to the ohmic contact on the main face of the $N^+$ type layer. This is because the substrate is of an N type conductivity. The reverse characteristic shown in a third quadrant of FIG. 2 is obtained with a reverse voltage across the device rendering both layers negative with respect to the ohmic contact.

In FIG. 2 it is noted that a forward current due to the forward voltage is expressed in milliamperes and that a reverse current due to the reverse voltage is expressed in microamperes. Also, with the substrate formed of a P type semiconductor material, the forward characteristic is presented with the reverse voltage as above described and the reverse characteristic is presented with the forward voltage as above described.

In FIG. 2 curve A depicts the embodiment or the present device while curve B depicts the conventional device.

The thermal stability of the voltage-to-current characteristics as shown in FIG. 2 was tested by taking notice of both a current (which is designated $I_{fiV}$) following through the device with a forward voltage at one volt applied thereacross and a voltage (which is designated by $V_{B10 \mu A}$) with which a reverse current of 10 microamperes flow through the device.

Figure 3:
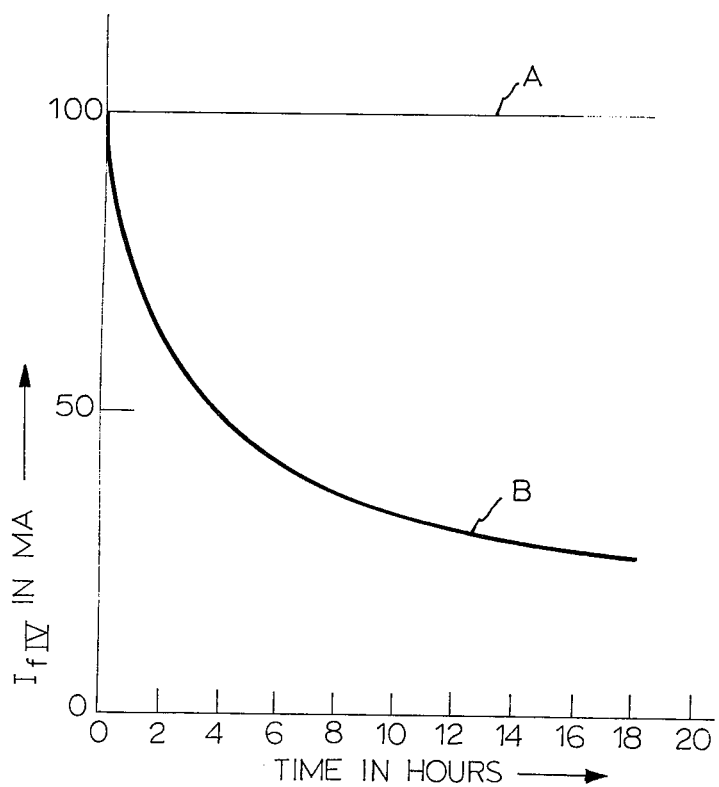
FIG. 3 is a graph similar to FIG. 2 but illustrating the thermal characteristic of a current relative to an applied voltage for the Schottky barrier involved.

While the present device or the embodiment and the conventional device were placed in the atmosphere at 200°C the current $I_{fiV}$ and the voltage $V_{B10 \mu A}$ were measured at predetermined time intervals, In FIG. 3, the measured values of the current $I_{fiV}$ in milliamperes are plotted in ordinate against a time interval in hours for which both devices are put in the atmosphere at 200°C, in abscissa. Curve A also describes the embodiment or the present device and curve B describes the conventional device.

In FIG. 3 it is seen that the current $I_{fV}$ remains substantially unchanged with time for the Schottky barrier formed in the embodiment and must desreases with time for the conventional Schottky barrier.

The results of similar tests concerning the voltage $V_{B10~\mu A}$ indicated that both devices did not change in that voltage within a time interval up to 20 hours.

From the foregoing it has been found that the semiconductor according to the present invention includes a Schottky barrier very excellent in the thermal stability as compared with conventional semiconductor device. Further the results of heat treatment of the present semiconductor devices in the atmosphere at 200°C. for 2,000 hours indicated that the Schottky barrier did not change in both $I_{f1V}$ and $V_{B10\mu A}$.

Since the Schottky barrier according to the present invention is thermally stable in the electric characteristics as above described, the semiconductor, devices of the present invention enclosed with appropriate packagings can have the average lifetime in excess of $10^7$ hours while the substrates involved are maintained at a temperature of 60°C.

Further it can be pointed out in FIG. 2 that the tendency for the forward current to be saturated in excess of 150 milliamperes appears in the conventional device but not in the present device. This means that the present invention is secondarily advantageous in that the Schottky barrier increases in permissible current.

What we claim is:

1. A semiconductor device comprising a substrate of semiconductive material, and a metallic member disposed on said substrate to be contacted by the latter thereby to form a Schottky barrier within said substrate adjacent that protion thereof contacted by said metallic member, said metallic member being composed of a nickel-palladium alloy.

2. A semiconductor device as claimed in claim 1 wherein said nickel-palladium alloy includes the number of palladium atoms not less than the number of nickel atoms.

3. A semicondutor device as claimed in claim 1 wherein said nickel-palladium alloy includes the number of palladium atoms not greater than four times the number of nickel atoms.

4. A semiconductor device as claimed in claim 1 wherein said nickel-palladium alloy has a ratio of nickel atoms to palladium atoms ranging from 50 to 50 to 20 to 80.

5. A semiconductor device as claimed in claim 1 wherein said metallic member is in the form of a metallic layer having a thickness not less than 0.1 microns.

6. A semiconductor device as claimed in claim 1 wherein said metallic member is in the form of a metallic layer having a thickness ranging from 0.3 to 1.0 microns.

7. A semiconductor device as claimed in claim 6 wherein said metallic layer is formed of nickel and palladium with a ratio of nickel atoms to palladium atoms ranging from 50 to 50 to 20 to 80.

8. A semiconductor device as claimed in claim 1 wherein said metallic member has another metallic member disposed thereupon.

9. A semiconductor device as claimed in claim 1 wherein said metallic member has disposed thereupon another metallic member formed of a metallic material selected from the group consisting of gold, aluminum, silver, copper, amd solders.

10. A semiconductor device comprising a substrate of semiconductive material including a pair of first and second main faces opposite to each other, a surface passivation film of electrically insulating material disposed so as to cover that portion of said first main face of said substrate except for a predetermined portion thereof, a first metallic layer formed of a nickel-palladium alloy and disposed so as to contact said predetermined portion of said first main face of said substrate thereby to form a Schottky barrier in said substrate adjacent that portion thereof contacted by said first metallic member, and a second metallic layer disposed to cover said first metallic layer, the sum of the thickness of said first and second metallic layers not exceeding the thickness of said surface passivation film.

11. A semiconductor device as claimed in claim 10 wherein said first metallic layer has a ratio of nickel atoms to palladium atoms ranging from 50 to 50 to 20 to 80.

12. A semiconductor device as claimed in claim 10 wherein said first metallic layer has a thickness ranging from 0.3 to 1.0 micron.

13. A semiconductor device as claimed in claim 10 wherein said second metallic layer is composed of a metallic material selected from the group consisting of gold, aluminum, silver, cooper and solders.

* * * * *